(12) United States Patent  
Chow et al.

(10) Patent No.: US 8,420,950 B2
(45) Date of Patent: Apr. 16, 2013

(54) CIRCUIT SYSTEM WITH LEADS AND METHOD OF MANUFACTURE THEREOF

(75) Inventors: Seng Guan Chow, Singapore (SG); Heap Hoe Kuan, Singapore (SG); Reza Argenty Pagaila, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 397 days.

(21) Appl. No.: 12/716,271

(22) Filed: Mar. 2, 2010

(65) Prior Publication Data
US 2011/0214911 A1    Sep. 8, 2011

(51) Int. Cl.
*H05K 1/16*    (2006.01)
(52) U.S. Cl.
USPC .................. 174/260; 29/832; 257/778
(58) Field of Classification Search ........ 29/832
See application file for complete search history.

(56) References Cited

U.S. PATENT DOCUMENTS

| | | | |
|---|---|---|---|
| 5,625,298 A * | 4/1997 | Hirano et al. | 324/754.08 |
| 5,660,321 A | 8/1997 | Ishida et al. | |
| 6,053,397 A | 4/2000 | Kaminski | |
| 6,085,968 A | 7/2000 | Swindlehurst et al. | |
| 6,333,565 B1 * | 12/2001 | Hashimoto | 257/781 |
| 6,498,503 B2 * | 12/2002 | Akram et al. | 324/750.05 |
| 6,503,777 B2 * | 1/2003 | Jackson | 438/106 |
| 6,661,247 B2 * | 12/2003 | Maruyama et al. | 324/756.05 |
| 6,686,664 B2 * | 2/2004 | Caletka et al. | 257/778 |
| 7,141,885 B2 * | 11/2006 | Kim | 257/779 |
| 7,368,817 B2 | 5/2008 | Pendse | |
| 7,550,317 B2 | 6/2009 | Kim | |

* cited by examiner

*Primary Examiner* — Ishwarbhai Patel
(74) *Attorney, Agent, or Firm* — Ishimaru & Associates LLP

(57) ABSTRACT

A method of manufacture of a circuit system includes: providing a carrier base; forming a cavity in the carrier base; forming a bridge lead over the cavity, the bridge lead exposing the cavity; and mounting a device having an anchor interconnect, the anchor interconnect is in the cavity and conformal to the bridge lead over the cavity.

20 Claims, 12 Drawing Sheets

CIRCUIT SYSTEM WITH LEADS AND METHOD OF MANUFACTURE THEREOF

TECHNICAL FIELD

The present invention relates generally to a circuit system, and more particularly to a system for a circuit system with leads.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made using the semiconductor package structures. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor (or "chip") packages are of the type where a semiconductor die is molded into a package with a resin, such as an epoxy molding compound. Numerous package approaches stack multiple integrated circuit dice or package in package (PIP) or a combination. Other approaches include package level stacking or package-on-package (POP). POP designs face reliability challenges and higher cost.

Thus, a need still remains for a circuit system improved yield, low profile, and improved reliability. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of a circuit system including: providing a carrier base; forming a cavity in the carrier base; forming a bridge lead over the cavity, the bridge lead exposing the cavity; and mounting a device having an anchor interconnect, the anchor interconnect is in the cavity and conformal to the bridge lead over the cavity.

The present invention provides a circuit system including: a carrier having a cavity; a bridge lead over the cavity, the bridge lead exposing the cavity; and a device having an anchoring interconnect over the carrier, the anchor interconnect in the cavity and conformal to the bridge lead over the cavity.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
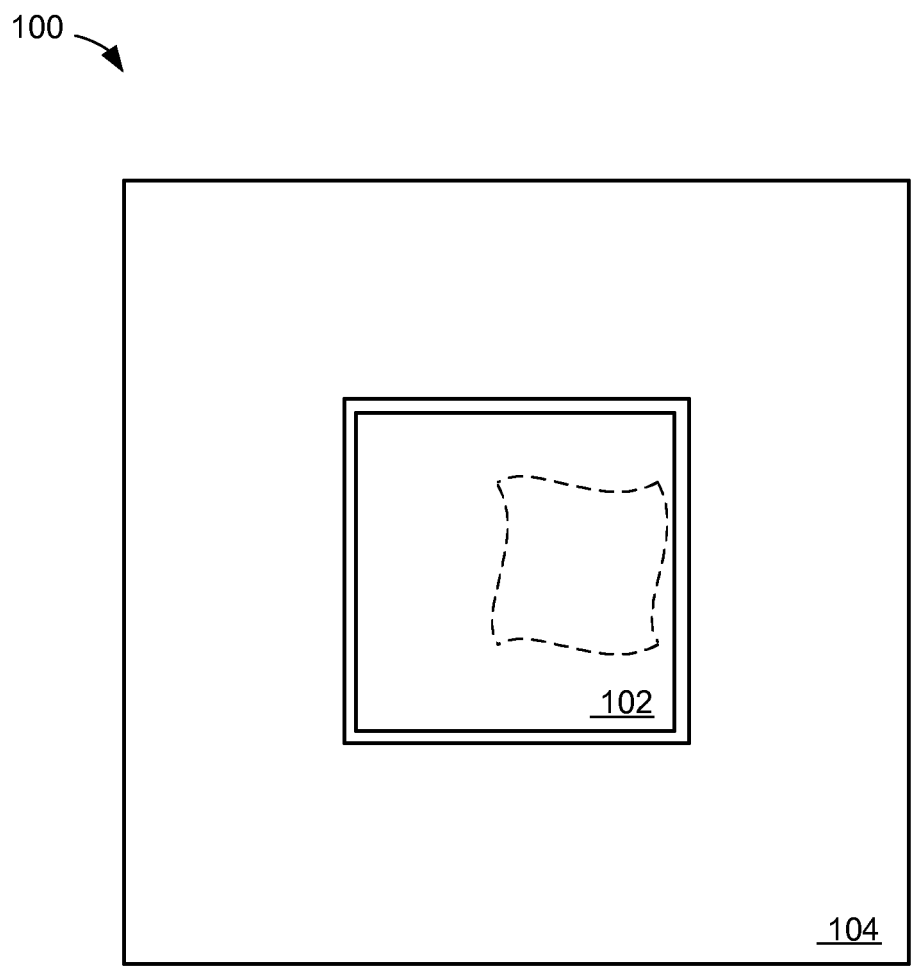
FIG. 1 is a top view of a circuit system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane.

The term "on" means there is direct contact between elements. The term "processing" as used herein includes deposition of material, patterning, exposure, development, etching, cleaning, molding, and/or removal of the material or as required in forming a described structure.

Referring now to FIG. 1, therein is shown a top view of a circuit system 100 in an embodiment of the present invention. The top view depicts a device 102, such as an integrated circuit die, a flip chip or a passive device, mounted over a carrier 104, such as a laminated substrate or a ceramic substrate.

For illustrative purposes, the circuit system 100 is shown having the device 102 mounted over an inner portion of the carrier 104, although it is understood that the device 102 can be over a different portion of the carrier 104. For example, the circuit system 100 can have the device 102 over an outer portion of the carrier 104.

For further illustrative purposes, the circuit system 100 is shown having one of the device 102 mounted over the carrier 104, although it is understood that more than one of the device 102 can be mounted over the carrier 104. For example, the circuit system 100 can have two or more of the device 102 mounted over the carrier 104.

Figure 2:
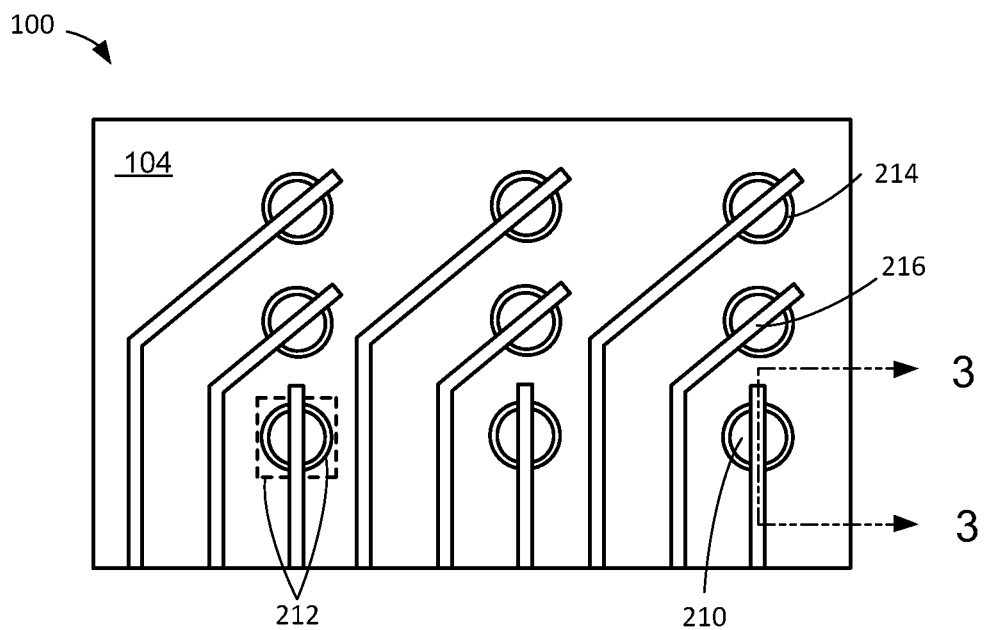
FIG. 2 is a more detailed top view of a portion of the carrier.

Referring now to FIG. 2, therein is a more detailed top view of a portion of the carrier 104. The more detailed view shows a portion of the carrier 104 without the device 102 of FIG. 1 as depicted within the dashed square of FIG. 1. The carrier 104 can have cavities 210. The cavities 210 can have cavity openings 212 at the surface of the carrier 104.

The cavity openings 212 can have a number of different geometric shapes. As an example, the detailed view depicts the cavity openings 212 having a circular geometric shape as depicted by the solid circle. As a further example, the cavity openings 212 can have a rectangular geometric shape as depicted by the dashed rectangle.

For illustrative purposes, the circuit system 100 is shown having the cavities 210 in an array configuration, although it is understood that the cavities 210 be in a different configuration. For example, the circuit system 100 can have the cavities 210 in a staggered configuration.

Optionally, the circuit system 100 can include interface pads 214, such as a conductive coating that can improve connectivity or wetting with the cavities 210. The interface pads 214 can be over and in the cavities 210. The interface pads 214 can be conformal to the cavities 210. The interface pads 214 can be made from a number of different materials. For example, the interface pads 214 can be made from conductive material, such as copper or a conductive alloy.

Bridge leads 216, such as conductive lead or trace, can be over the carrier 104. The bridge leads 216 can be over and span completely across the cavity openings 212 at a diameter. The bridge leads 216 can expose the cavities 210 on opposing sides of the diameter. Optionally, the bridge leads 216 can be over and connected to the interface pads 214. The bridge leads 216 can be made from a number of different materials. For example, the bridge leads 216 can be made from conductive materials such as copper, a conductive alloy, or a material similar to the material used to make the interface pads 214.

For illustrative purposes, the circuit system 100 is shown with the bridge leads 216 across the diameter of the cavity openings 212, having the circular geometric shape, in a linear path although it is understood that the bridge leads 216 can be across a different portion of the cavity openings 212. For example, the circuit system 100 can have the bridge leads 216 span across a secant of the cavity openings 212. As a further example, the circuit system 100 can have the bridge leads 216 span across the cavity openings 212 in non-linear, curved, or angular path.

Figure 3:
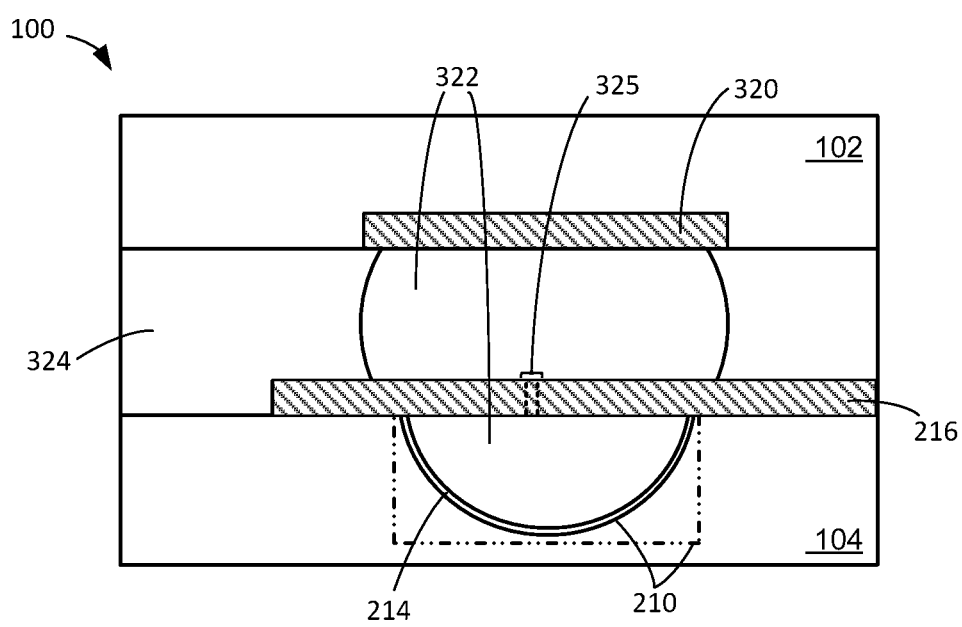
FIG. 3 is a cross-sectional view of the carrier along line 3-3 of FIG. 2 with the device mounted over the carrier.

Referring now to FIG. 3, therein is a cross-sectional view of carrier 104 along line 3-3 of FIG. 2 with the device 102 mounted the carrier 104. The cross-sectional view depicts a portion of the device 102 mounted over the carrier 104. The device 102 can have mounting pads 320 exposed along a surface of the device 102. Anchor interconnects 322, such as solder balls, solder bumps, or conductive bumps, can connect the mounting pads 320 and the carrier 104.

The anchor interconnects 322 can be connected to the bridge leads 216. The anchor interconnects 322 can surround and be conformal to a substantial portion of the anchor interconnects 322 over the cavities 210. The anchor interconnects 322 can form an interlock structure with the bridge leads 216.

The anchor interconnects 322 can substantially fill and be conformal to the cavities 210. Optionally, the anchor interconnects 322 can be connected and conformal to the interface pads 214. The anchor interconnects 322 can substantially fill the cavities 210 and cover a substantial portion of the interface pads 214.

The cavities 210 can be exposed from the carrier 104. The cavities 210 can have a number of different geometric shapes. As an example, the cavities 210 can have a semi-spherical geometric shape with the cross-sectional view showing the cavities 210 as a semi-circular geometric shape as depicted by the solid line. As a further example, the cavities 210 can have a cylindrical geometric shape with the cross-sectional view showing the cavities 210 as a rectangular geometric shape as depicted by the dashed line.

The circuit system 100 can have an encapsulation 324, such as an underfill or molded underfill including an epoxy molding compound or a wire in film, between the carrier 104 and the device 102. The encapsulation 324 can cover the bridge leads 216, the anchor interconnects 322, and the mounting pads 320. Optionally, the encapsulation 324 can cover the interface pads 214.

In a different example, the bridge leads 216 can include a gap 325, as depicted by the dashed lines, over and on substantially opposite sides of the cavities 210. The gap 325 can represent a partial or complete breakage of the bridge leads 216 over the cavities 210.

Interconnection of the gap 325 of the bridge leads 216 can be maintained by the anchor interconnects 322. The anchor interconnects 322 can surround and connect across the gap 325 of the bridge leads 216 over the cavities 210. The anchor interconnects 322 can be conformal to the gap 325 of the bridge leads 216 over the cavities 210. Optionally, interconnection across the gap 325 of the bridge leads 216 can be maintained through connection with the interface pads 214, which can provide an alternate connectivity path for the bridge leads 216.

It has been discovered that the present invention provides the circuit system 100 having increased input/output (I/O) capacity. The cavities 210 allow the anchor interconnects 322 to expand and flow into the cavities 210. This can prevent the anchor interconnects 322 from expanding laterally and shorting adjacent bridge leads 216. The anchor interconnects 322 enables manufacturers to reduce the pitch between leads and increase lead density, thereby increase the number of I/O.

It has also been discovered that the present invention provides the circuit system 100 having improved connectivity and improved reliability. The optional interface pads 214 can improve joint reliability and connectivity between the anchor interconnects 322 and the carrier 104 by providing a wettable area inside the cavities 210. In addition, the anchor interconnects 322 can expand and flow into the cavities and can surround the bridge leads 216 increasing the contact area between the anchor interconnects 322 and the bridge leads 216. Furthermore, the anchor interconnects 322 can maintain interconnection of the bridge leads 216 in the event of a breakage of the bridge leads 216. Optionally, the interface pads 214 can provide interconnection by providing an alternate connective path for the bridge leads 216. The improved connectivity can improve product reliability and thus reducing overall manufacturing cost due to part failure.

Figure 4:
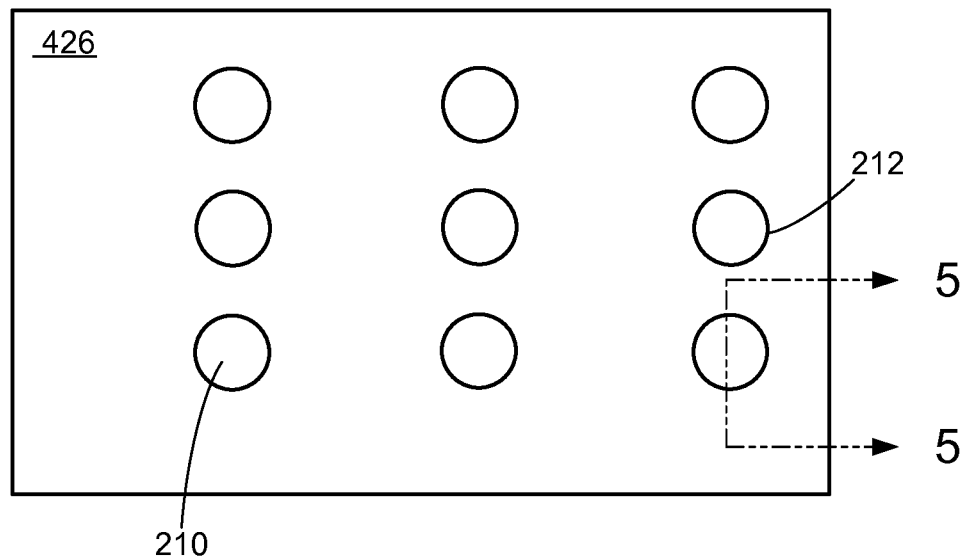
FIG. 4 is a top view of a portion of a carrier base.

Referring now to FIG. 4, therein is shown a top view of a portion of a carrier base 426. As an example, the carrier base 426 can be a laminated substrate or a ceramic substrate. The cavities 210 can be formed in the carrier base 426. The cavity openings 212 can be formed along the surface of the carrier base 426. The cavity openings 212 can be formed to have a number of different geometric shapes. For example, the carrier base 426 is shown having the cavity openings 212 in a circular geometric shape.

Figure 5:
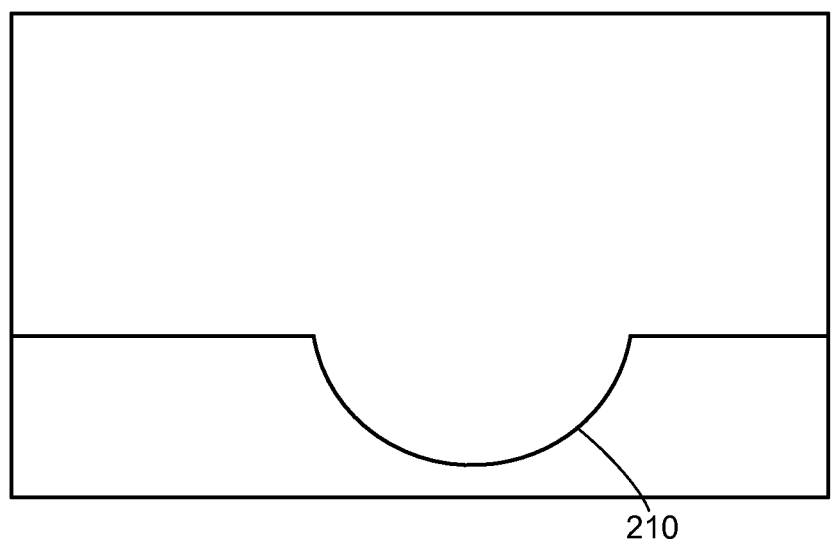
FIG. 5 is a cross-sectional view of the structure of FIG. 4 along line 5-5 of FIG. 4.

Referring now to FIG. 5, therein is shown a cross-sectional view of the structure of FIG. 4 along line 5-5 of FIG. 4. The cavities 210 can be formed to have a number of different shapes. For example, the cavities 210 can be formed to have a semi-spherical geometric shape with the cross-sectional view showing the cavities 210 as a semi-circular geometric shape, as depicted by the solid line. In another example, the cavities 210 can be formed to have a cylindrical geometric shape with the cross-sectional view showing the cavities 210 as a rectangular geometric shape, as depicted by the dash-dot-dot-dash line.

The cavities 210 can be formed in a number of different methods. For example, the cavities 210 can be formed through processes such as mechanical drilling, etching, or laser drilling.

Figure 6:
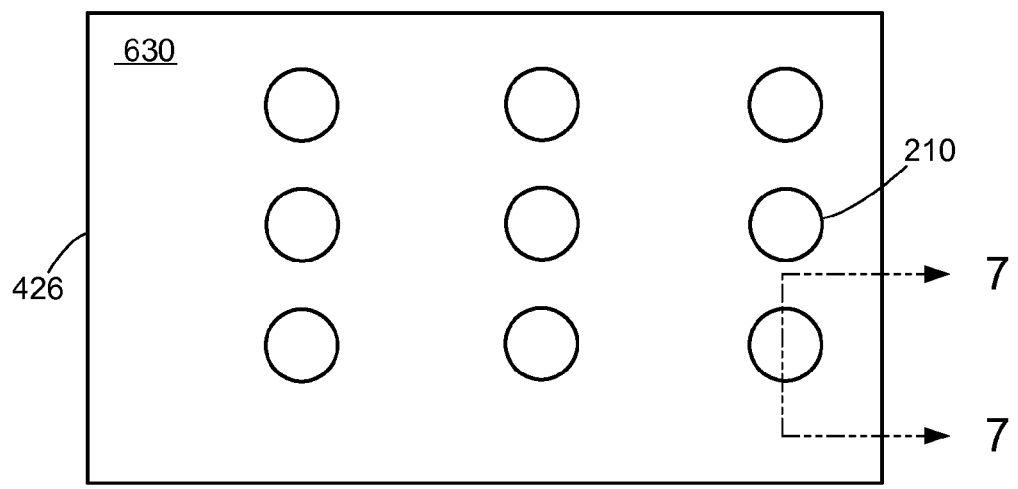
FIG. 6 is a top view of the structure of FIG. 4 in forming a first conductive layer.

Referring now to FIG. 6, therein is shown a top view of the structure of FIG. 4 in forming a first conductive layer 630. The first conductive layer 630 can include a thin seed layer or sheet of conductive material, such as copper or a conductive alloy. The first conductive layer 630 can be over the carrier base 426. The first conductive layer 630 can be over and in the cavities 210. Forming the first conductive layer 630 is optional.

Figure 7:
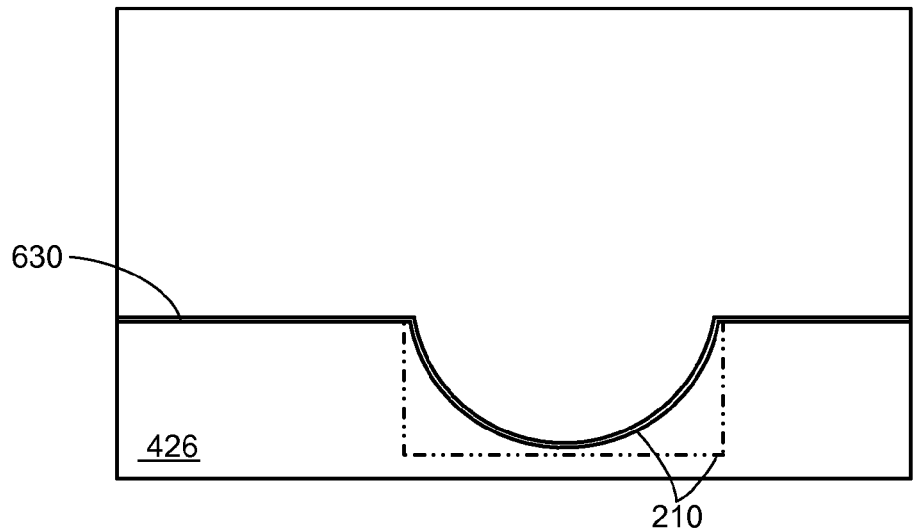
FIG. 7 is a cross-sectional view of the structure of FIG. 6 along line 7-7 of FIG. 6.

Referring now to FIG. 7, therein is shown a cross-sectional view of the structure of FIG. 6 along line 7-7 of FIG. 6. The first conductive layer 630 can be conformal to the carrier base 426 and the cavities 210. The first conductive layer 630 can be formed by a number of different methods. For example, the first conductive layer 630 can be formed by electrolysis, physical vapor deposition or chemical vapor deposition.

Figure 8:
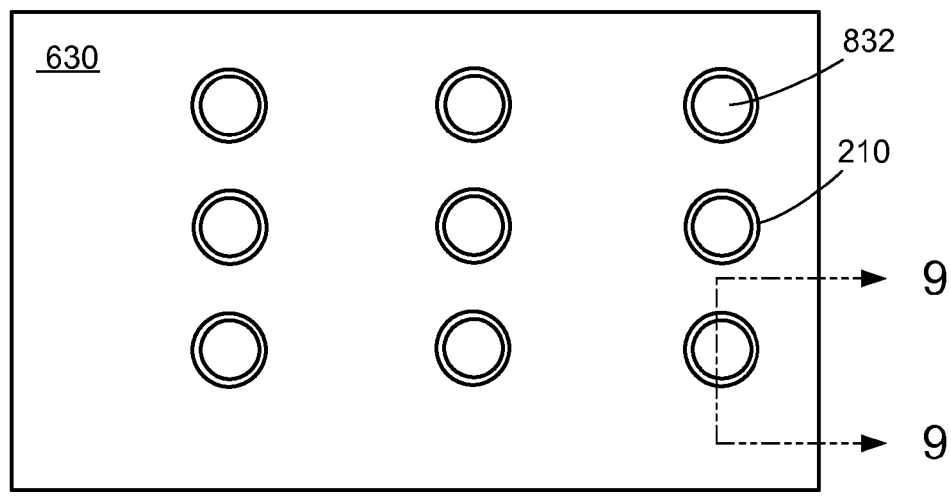
FIG. 8 is a top view of the structure of FIG. 6 in forming a filler.

Referring now to FIG. 8, therein is shown a top view of the structure of FIG. 6 in forming a filler 832. The filler 832 can include a sacrificial material, such as a B-staged polymer or a heat releasable material, including a polymer, used to retain or hold a shape during processing. Alternatively, the filler 832 can be made of a non-sacrificial material, such as a conductive material similar to the material used to form the anchor interconnects 322. The filler 832 can be formed over the first conductive layer 630 and in the cavities 210.

The filler 832 can be formed by a number of different methods. For example, the filler 832 can be formed by spin coating, screen printing or stencil printing.

Figure 9:
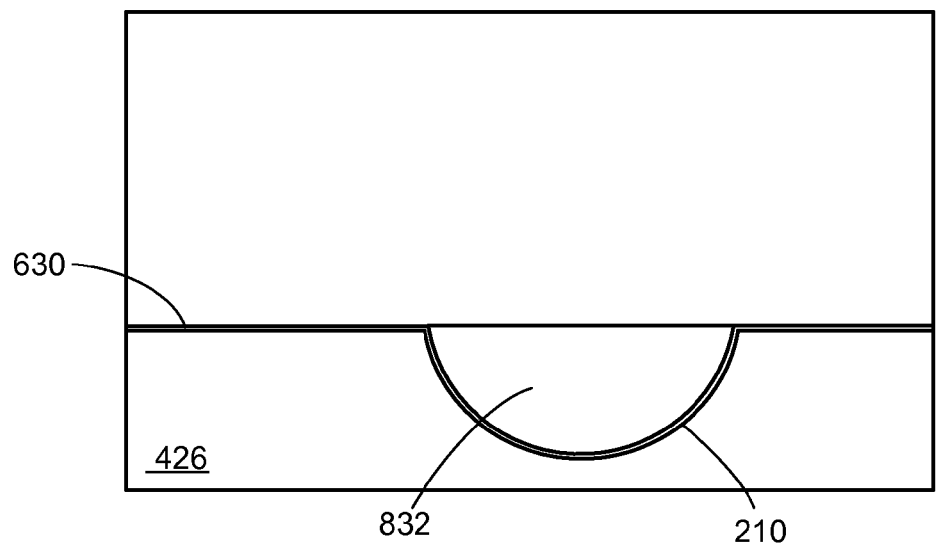
FIG. 9 is a cross-sectional view of the structure of FIG. 8 along line 9-9 of FIG. 8.

Referring now to FIG. 9, therein is shown a cross-sectional view of the structure of FIG. 8 along line 9-9 of FIG. 8. The filler 832 can be formed to be conformal to the cavities 210. The portion of the filler exposed from the cavity openings 212 can be formed to be co-planar with the surface of the carrier base 426. Optionally, the filler 832 can be formed to be co-planar with the portion of the first conductive layer 630 that is not within the cavities 210.

Figure 10:
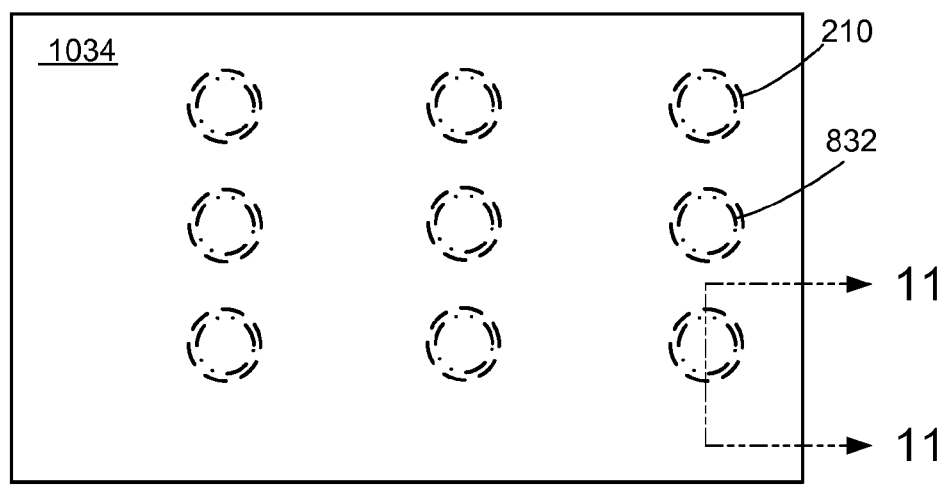
FIG. 10 is a top view of the structure of FIG. 8 in forming a second conductive layer.

Referring now to FIG. 10, therein is shown a top view of the structure of FIG. 8 in forming a second conductive layer 1034. The second conductive layer 1034 can include a thin seed layer or sheet of conductive material, such as copper, a conductive alloy or a material similar to the material used to form the first conductive layer 630 of FIG. 8. The second conductive layer 1034 can be over the first conductive layer 630 and the cavities 210, as depicted by the dashed circles, and can cover the portion of the filler 832 exposed from the cavities 210, as depicted by the dash-dot-dot-dash circles.

Figure 11:
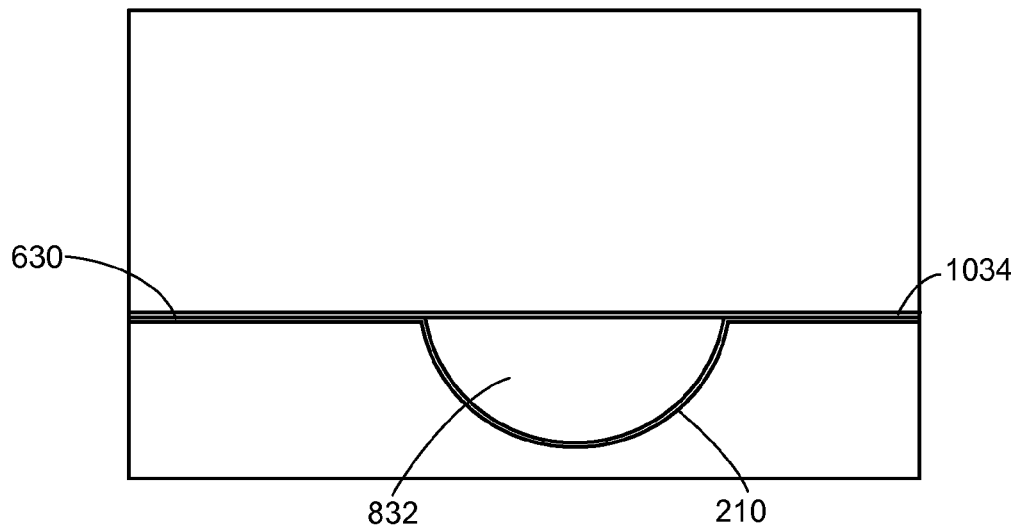
FIG. 11 is a cross-sectional view of the structure of FIG. 10 along line 11-11 of FIG. 10.

Referring now to FIG. 11, therein is shown a cross-sectional view of the structure of FIG. 10 along line 11-11 of FIG. 10. The second conductive layer 1034 can be over the portion of the first conductive layer that is not in the cavities 210. The second conductive layer 1034 can be over the filler 832 in the cavities 210. The second conductive layer 1034 can form a planar surface over the first conductive layer 630 and the filler 832.

The second conductive layer 1034 can be formed by a number of different methods. For example, the second conductive layer 1034 can be formed by electrolysis, physical vapor deposition or chemical vapor deposition.

Figure 12:
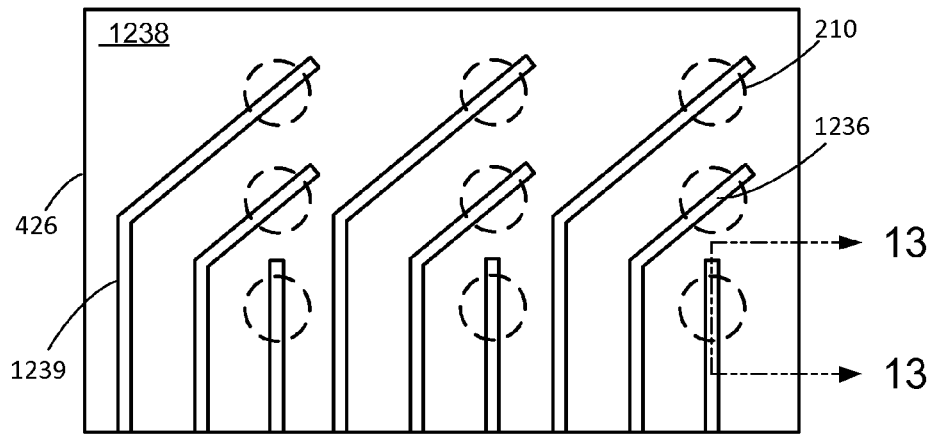
FIG. 12 is a top view of the structure of FIG. 10 in forming conductive leads.

Referring now to FIG. 12, therein is shown a top view of the structure of FIG. 10 in forming conductive leads 1236. A mask 1238, such as a patterned or developed photo-resist coating, can be formed over the carrier base 426. The mask 1238 can have channels 1239. The channels 1239 can have the shape of the bridge leads 216 of FIG. 2.

The conductive leads 1236 can be formed in the channels 1239. The conductive leads 1236 can be over the cavities 210, as depicted by the dashed circles. The conductive leads 1236 can be made from a number of different materials. For example, the conductive leads 1236 can be made from conductive material such as copper, a conductive alloy, a material similar to the material used to form the first conductive layer 630, the second conductive layer 1034, or the bridge leads 216.

Figure 13:
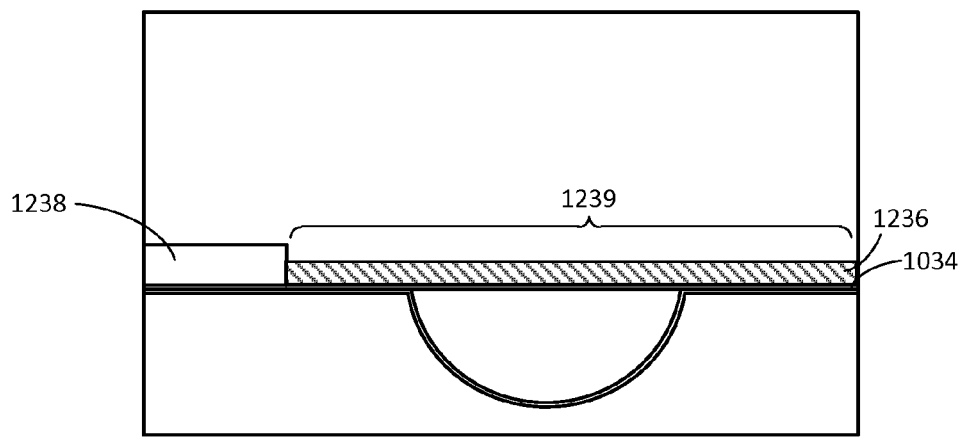
FIG. 13 is a cross-sectional view of the structure of FIG. 12 along line 13-13 of FIG. 12.

Referring now to FIG. 13, therein is shown a cross-sectional view of the structure of FIG. 12 along line 13-13 of FIG. 12. The mask 1238 can be over the second conductive layer 1034. The channels 1239 can expose a portion of the second conductive layer 1034. The conductive leads 1236 can be formed in the channels 1239 and over the second conductive layer 1034.

The conductive leads 1236 can be formed by a number of different methods. For example, the conductive leads 1236 can be formed by electro-plating, chemical vapor deposition, or physical vapor deposition.

Figure 14:
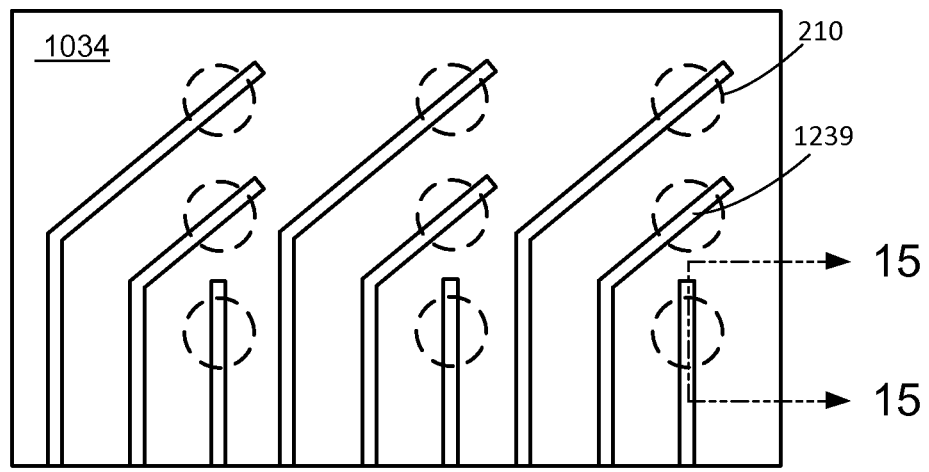
FIG. 14 is a top view of the structure of FIG. 12 in removing the mask.

Referring now to FIG. 14, therein is shown a top view of the structure of FIG. 12 in removing the mask 1238 of FIG. 12. Removing the mask 1238 can expose the second conductive layer 1034. The conductive leads 1236 can be over the cavities 210, as depicted by the dashed circles.

Figure 15:
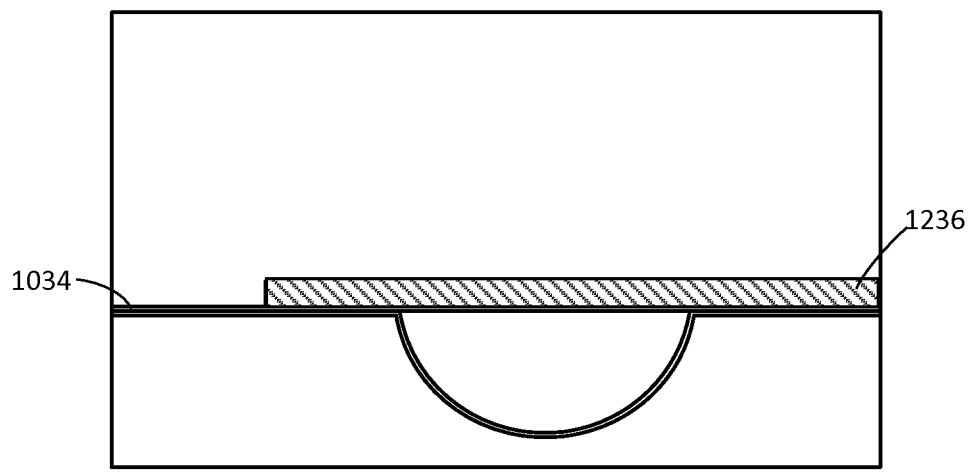
FIG. 15 is a cross-sectional view of the structure of FIG. 14 along line 15-15 of FIG. 14.

Referring now to FIG. 15, therein is shown a cross-sectional view of the structure of FIG. 14 along line 15-15 of FIG. 14. Removing the mask 1238 of FIG. 12 can expose the portion of the second conductive layer 1034 that is not under the conductive leads 1236.

The mask 1238 can be removed by a number of different methods. For example, the mask 1238 can be removed by methods such as resist stripping or oxidizing the mask 1238.

Figure 16:
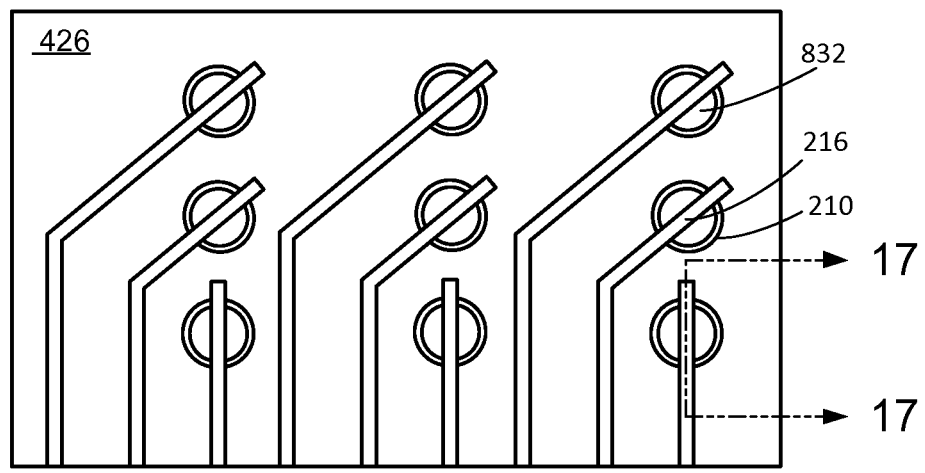
FIG. 16 is a top view of the structure of FIG. 14 in forming the bridge leads.

Referring now to FIG. 16, therein is shown a top view of the structure of FIG. 14 in forming the bridge leads 216. Portions of the first conductive layer 630 of FIG. 6 and the second conductive layer 1034 of FIG. 10 can be removed to expose the carrier base 426 and the filler 832. Removing a portion of the first conductive layer 630 and the second conductive layer 1034 can form the bridge leads 216. Forming the bridge leads 216 can expose the cavities 210.

Figure 17:
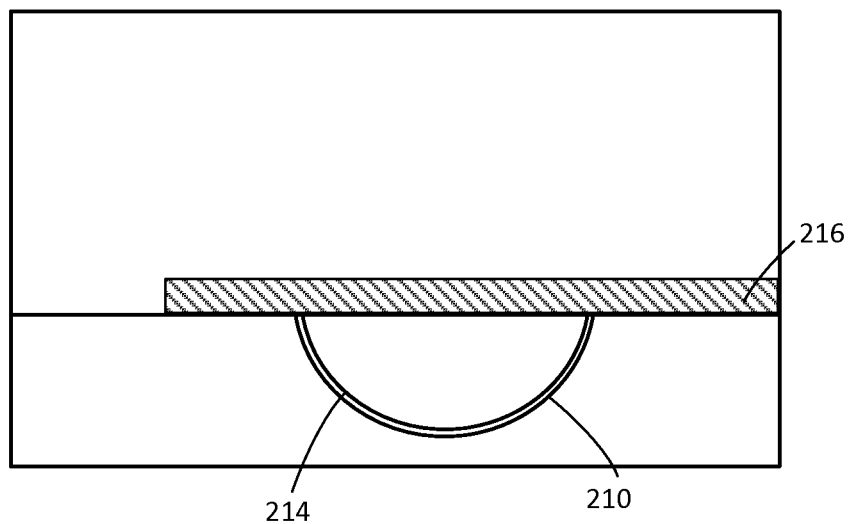
FIG. 17 is a cross-sectional view of the structure of FIG. 16 along line 17-17 of FIG. 16.

Referring now to FIG. 17, therein is shown a cross-sectional view of the structure of FIG. 16 along line 17-17 of FIG. 16. Removing the portion of the first conductive layer 630 of FIG. 6 and the second conductive layer 1034 of FIG. 10 does not remove the portion of the first conductive layer 630 or the second conductive layer 1034 under the conductive leads 1236 of FIG. 12. The conductive leads 1236, the portion of the first conductive layer 630 and the second conductive layer 1034 under the conductive leads 1236 can form the bridge leads 216.

Optionally, the portion of the first conductive layer 630 in the cavities 210 are not removed. The portion of the first conductive layer 630 in the cavities 210 can form the interface pads 214. The bridge leads 216 can be connected to the interface pads 214.

Portions of the first conductive layer 630 and the second conductive layer 1034 can be removed by a number of different methods. For example, the first conductive layer 630 and the second conductive layer 1034 can be removed by chemical etching or stripping. A protective coat (not shown) can be over the conductive leads 1236 to prevent removal of the conductive leads 1236 when portions the first conductive layer 630 and the second conductive layer 1034 are removed.

Figure 18:
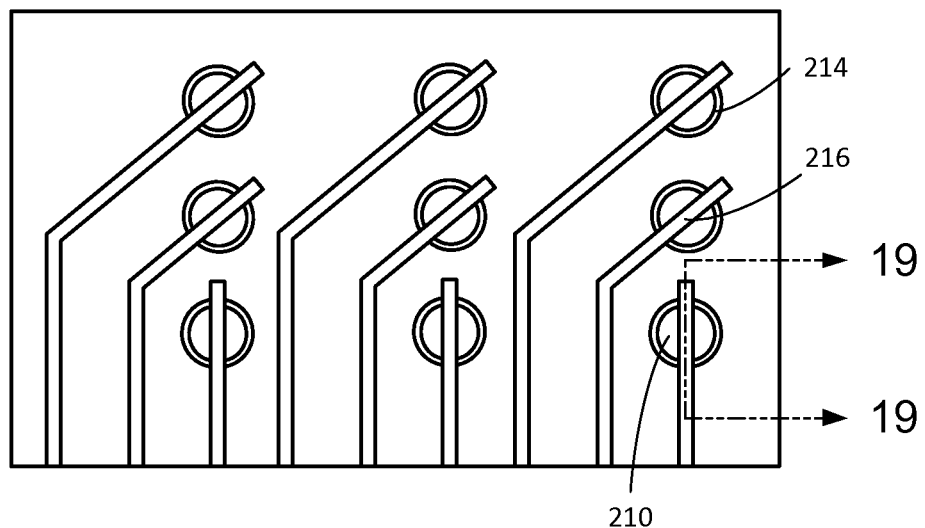
FIG. 18 is a top view of the structure of FIG. 16 in removing the filler of FIG. 7.

Referring now to FIG. 18, therein is shown a top view of the structure of FIG. 16 in removing the filler 832 of FIG. 7. Removing the filler 832 can expose the cavities 210. The bridge leads 216 can be over and expose the cavities 210. Optionally, removing the filler 832 can expose the portion of the first conductive layer 630 of FIG. 6 in the cavities 210 to form the interface pads 214.

Figure 19:
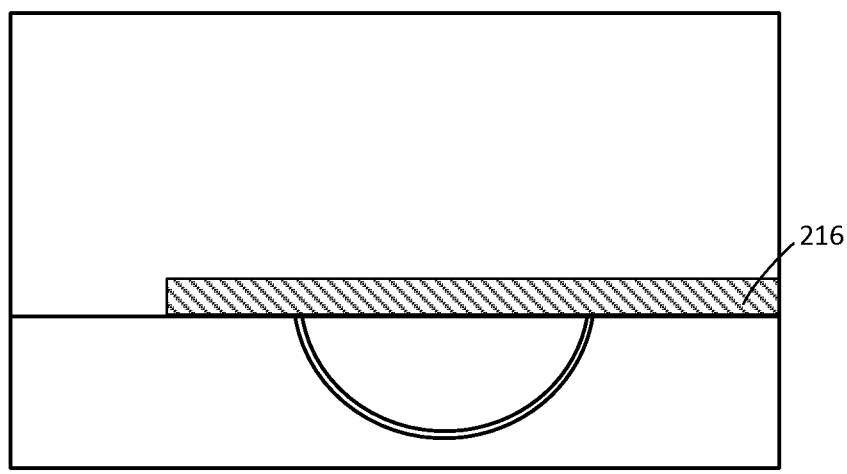
FIG. 19 is a cross-sectional view of the structure of FIG. 18 along line 19-19 of FIG. 18.

Referring now to FIG. 19, therein is shown a cross-sectional view of the structure of FIG. 18 along line 19-19 of FIG. 18. The filler 832 of FIG. 8 can be removed by a number of different methods. For example, the filler 832 can be removed by a chemical process such as wet etching or a heating process such as baking.

Figure 20:
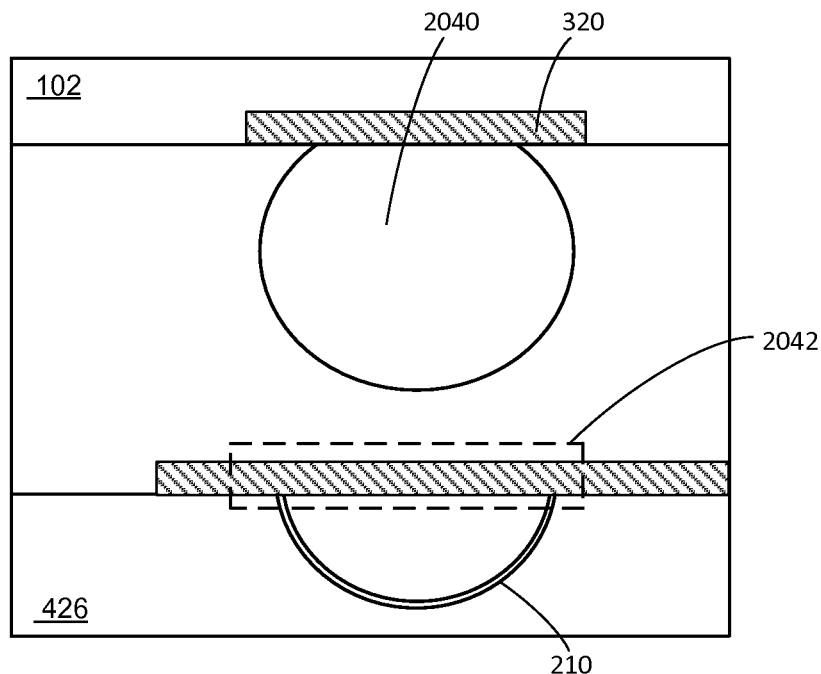
FIG. 20 is the structure of FIG. 19 in mounting the device.

Referring now to FIG. 20, therein is shown the structure of FIG. 19 in mounting the device 102. Mounting interconnects 2040, such as a solder ball, a solder bump, or a conductive bump, can be attached to the mounting pads 320 of the device 102.

The cavities 210 can be below an interconnect mounting area 2042 as depicted by the dashed rectangle. The device 102 can be mounted over the carrier base 426 with the mounting interconnects 2040. The mounting interconnects 2040 can be connected to the carrier base 426 in the interconnect mounting area 2042.

Figure 21:
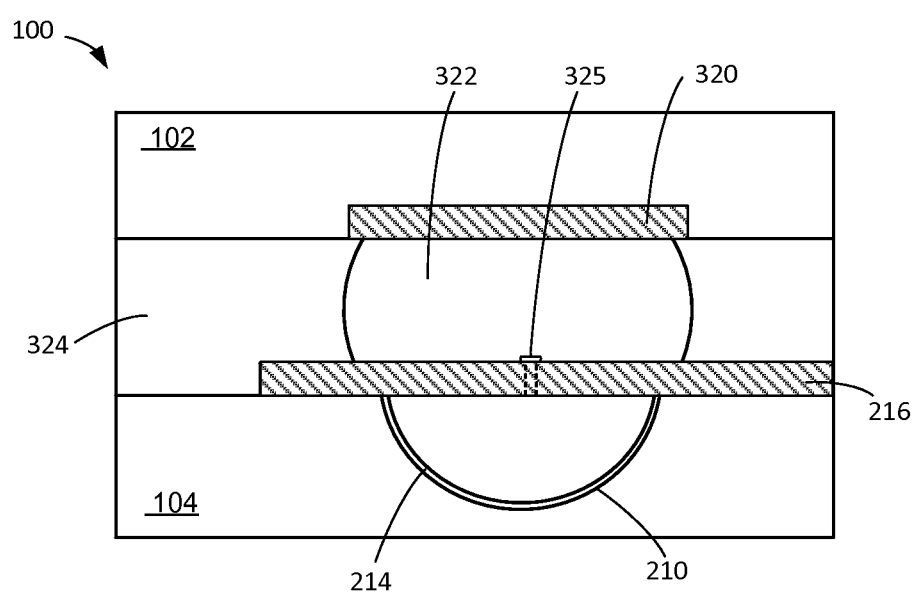
FIG. 21 is the structure of FIG. 20 in forming the circuit system.

Referring now to FIG. 21, therein is shown the structure of FIG. 20 in forming the circuit system 100. The mounting interconnects 2040 of FIG. 20 can flow around and be conformal to the bridge leads 216 over the cavities 210 and flow and expand into and substantially fill the cavities 210 to form the anchor interconnects 322. Expanding into the cavities 210 can reduce lateral expansion of the anchor interconnects 322 and prevent shorting with other bridge leads 216. The device 102 can have the anchor interconnects 322.

The anchor interconnects 322 can be formed around and be connected to the bridge leads 216. The anchor interconnects 322 can surround and connect to the bridge leads 216 over the cavities 210.

The anchor interconnects 322 can be formed to substantially fill and be conformal to the cavities 210. Optionally, the anchor interconnects 322 can be formed to connect to the interface pads 214. The anchor interconnects 322 can substantially fill the cavities 210 and cover a substantial portion of the interface pads 214.

In a different example, the bridge leads 216 can include the gap 325, as depicted by the dashed lines, and the portions of the bridge leads 216 at the different sides of the gap 325 can be over and on substantially opposite sides of the cavities 210. The gap 325 can be a partial or complete breakage of the bridge leads 216 over the cavities 210. The gap 325 of the bridge leads 216 can be formed by for a number of different reasons. For example, the gap 325 of the bridge leads 216 can be formed when flowing the mounting interconnect 2040 into the cavities 210 and conformal to the bridge lead 216 to form the anchor interconnect 322 or during a heating process.

Interconnection across the gap 325 of the bridge leads 216 can be maintained by the anchor interconnects 322. The anchor interconnects 322 can surround and connect across the gap 325 of the bridge leads 216 over the cavities 210. The anchor interconnects 322 can be formed by flowing the mounting interconnect 2040 conformal to and can connect across the gap 325 of the bridge leads 216 over and on substantially opposite sides of the cavities 210. Optionally, interconnection of the bridge leads 216 can be maintained through the connection with the interface pads 214, which can provide an alternate connectivity path for the bridge leads 216.

The anchor interconnects 322 can be formed by a number of different methods. For example, the anchor interconnects 322 can be formed by a reflow or heating process.

The encapsulation 324 can be formed between the device 102 and the carrier base 426. The encapsulation can cover the bridge leads 216, the anchor interconnects 322, and the mounting pads 320. Optionally, the encapsulation 324 can cover the interface pads 214.

The carrier base 426 can be singulated to form the carrier 104 and the circuit system 100. The carrier base 426 can be singulated by a number of different methods. For example, the carrier base 426 can be singulated by a cutting process such as sawing or laser cutting.

Figure 22:
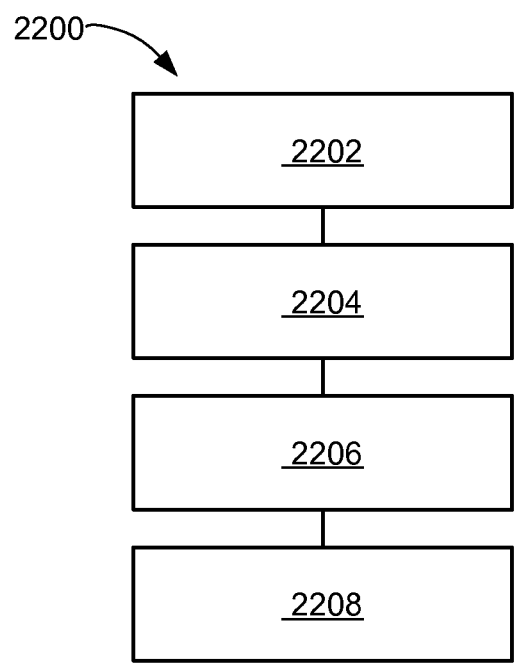
FIG. 22 is a flow chart of a method of manufacture of the circuit system in a further embodiment of the present invention.

Referring now to FIG. 22, therein is shown a flow chart of a method 2200 of manufacture of the circuit system 100 in a further embodiment of the present invention. The method 2200 includes providing a carrier base in a block 2202; forming a cavity in the carrier base in a block 2204; forming a bridge lead over the cavity, the bridge lead exposing the cavity in a block 2206; and mounting a device having an anchor interconnect, the anchor interconnect is in the cavity and conformal to the bridge lead over the cavity in a block 2208.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of a circuit system comprising:
providing a carrier base;
forming a cavity in the carrier base;
forming a bridge lead over and completely across the cavity, a portion of the cavity exposed from the bridge lead; and
mounting a device having an anchor interconnect, the anchor interconnect filling the cavity and conformal to the bridge lead over the cavity.

2. The method as claimed in claim 1 wherein:
forming the cavity includes forming an interface pad in and conformal to the cavity; and
mounting the device includes mounting the device having the anchor interconnect connected to the interface pad.

3. The method as claimed in claim 1 wherein:
forming the cavity includes forming an interface pad in and conformal to the cavity; and
forming the bridge lead over the cavity includes connecting the bridge lead and the interface pad.

4. The method as claimed in claim 1 wherein mounting the device includes mounting the device having the anchor interconnect conformal to a gap of the bridge lead, the gap over the cavity.

5. The method as claimed in claim 1 wherein forming the cavity includes forming the cavity having a semi-spherical geometric shape.

6. A method of manufacture of a circuit system comprising:
providing a carrier base;
forming a cavity in the carrier base;
forming a bridge lead over and completely across the cavity, a portion of the cavity exposed from the bridge lead;
mounting a device having an anchor interconnect, the anchor interconnect filling the cavity and conformal to the bridge lead over the cavity; and
forming an encapsulation between the device and the carrier base and covering the anchor interconnect and the bridge lead.

7. The method as claimed in claim 6 further comprising:
forming a filler in the cavity; and
wherein:
forming the bridge lead over the cavity includes forming the bridge lead over the filler.

8. The method as claimed in claim 6 wherein mounting the device includes mounting the device having the anchor interconnect conformal to the cavity.

9. The method as claimed in claim 6 wherein forming the cavity includes forming the cavity having a cylindrical geometric shape.

10. The method as claimed in claim 6 wherein mounting the device includes mounting a flip chip.

11. A circuit system comprising:
a carrier having a cavity;
a bridge lead over and completely across the cavity, a portion of the cavity exposed from the bridge lead; and
a device having an anchoring interconnect over the carrier, the anchor interconnect filling the cavity and conformal to the bridge lead over the cavity.

12. The system as claimed in claim 11 further comprising:
an interface pad in and conformal to the cavity; and
wherein:
the anchor interconnect is connected to the interface pad.

13. The system as claimed in claim 11 further comprising:
an interface pad in and conformal to the cavity; and
wherein:
the bridge lead is connected to the interface pad.

14. The system as claimed in claim 11 wherein:
the bridge lead includes the bridge lead having a gap over the cavity; and
the anchor interconnect is conformal to and connects the gap of the bridge lead.

15. The system as claimed in claim 11 wherein the cavity has a semi-spherical geometric shape.

16. The system as claimed in claim 11 further comprising an encapsulation between the device and the carrier and covering the anchor interconnect and bridge lead.

17. The system as claimed in claim 16 wherein the anchor interconnect is conformal to the cavity.

18. The system as claimed in claim 16 wherein the cavity has a cylindrical geometric shape.

19. The system as claimed in claim 16 wherein:
the device includes a mounting pad; and
the anchor interconnect is connected to the mounting pad.

20. The system as claimed in claim 16 wherein the device includes a flip-chip.

* * * * *